United States Patent
Lee

(10) Patent No.: US 7,382,671 B2
(45) Date of Patent: Jun. 3, 2008

(54) METHOD FOR DETECTING COLUMN FAIL BY CONTROLLING SENSE AMPLIFIER OF MEMORY DEVICE

(75) Inventor: Geun Il Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/882,442

(22) Filed: Jul. 1, 2004

(65) Prior Publication Data

US 2005/0254323 A1 Nov. 17, 2005

(30) Foreign Application Priority Data

May 17, 2004 (KR) .................. 10-2004-0034897

(51) Int. Cl.
*G11C 7/00* (2006.01)
*G11C 29/00* (2006.01)

(52) U.S. Cl. .............. 365/205; 365/207; 365/208; 365/189.08; 365/201

(58) Field of Classification Search .......... 365/200, 365/201, 185.09, 205, 207, 208, 189.08; 327/51, 57

See application file for complete search history.

(56) References Cited

U.S. PATENT DOCUMENTS

| | | | | |
|---|---|---|---|---|
| 4,421,996 A * | 12/1983 | Chuang et al. | | 327/57 |
| 4,551,641 A * | 11/1985 | Pelley, III | | 365/205 |
| 4,694,205 A * | 9/1987 | Shu et al. | | 327/57 |
| 5,339,273 A * | 8/1994 | Taguchi | | 365/205 |
| 5,559,745 A * | 9/1996 | Banik et al. | | 365/205 |
| 5,687,126 A * | 11/1997 | Hirano et al. | | 365/208 |
| 6,031,779 A * | 2/2000 | Takahashi et al. | | 365/205 |
| 6,034,886 A * | 3/2000 | Chan et al. | | 365/205 |
| 6,064,605 A * | 5/2000 | Muranaka et al. | | 365/205 |
| 6,111,797 A * | 8/2000 | Shirley | | 365/200 |
| 6,115,300 A * | 9/2000 | Massoumi et al. | | 365/200 |
| 6,147,514 A * | 11/2000 | Shiratake | | 327/57 |
| 6,373,758 B1 * | 4/2002 | Hughes et al. | | 365/200 |
| 6,442,094 B2 * | 8/2002 | Shore | | 365/200 |
| 6,529,436 B1 * | 3/2003 | Brown | | 365/226 |
| 6,738,282 B2 * | 5/2004 | Jo | | 365/205 |
| 6,751,137 B2 * | 6/2004 | Park et al. | | 365/205 |
| 6,813,184 B2 * | 11/2004 | Lee | | 365/185.09 |
| 6,876,588 B2 * | 4/2005 | Kato et al. | | 365/200 |
| 6,915,467 B2 * | 7/2005 | Pilo | | 365/201 |
| 6,934,208 B2 * | 8/2005 | Thompson et al. | | 365/205 |
| 6,937,529 B2 * | 8/2005 | Endo | | 365/205 |
| 6,999,357 B2 * | 2/2006 | Tanishima et al. | | 365/207 |
| 7,038,959 B2 * | 5/2006 | Garni | | 365/207 |
| 7,042,776 B2 * | 5/2006 | Canada et al. | | 365/207 |
| 7,161,847 B2 * | 1/2007 | Lee | | 365/207 |

FOREIGN PATENT DOCUMENTS

KR 1996 014602 10/1995
KR 1999 014080 2/1999

* cited by examiner

*Primary Examiner*—Trong Phan
(74) *Attorney, Agent, or Firm*—Ladas & Parry LLP

(57) ABSTRACT

Disclosed is a method for detecting a column fail by controlling a sense amplifier of a memory device. The method includes the steps of enabling a word line of a memory cell of the memory device, adjusting a timing of a high-level driving voltage and a low-level driving voltage applied to the sense amplifier, and detecting an amplification result of the sense amplifier.

6 Claims, 5 Drawing Sheets

METHOD FOR DETECTING COLUMN FAIL BY CONTROLLING SENSE AMPLIFIER OF MEMORY DEVICE

BACKGROUND OF THE INVENTION

1. Field of the Invention

The present invention relates to a method for testing a memory cell by controlling a sense amplifier of a memory device, and more particularly to a test method capable of previously detecting a column fail of a memory device by adjusting a timing of driving voltage applied to a sense amplifier when a wafer level test is carried out.

2. Description of the Prior Art

As is generally known in the art, semiconductor wafers are subject to at least two test processes (that is, a wafer level test and a package level test) before the semiconductor wafers have been fabricated as semiconductor articles. Such test processes for the semiconductor wafers are inevitably necessary in order to achieve semiconductor articles having no defects.

The test processes are carried out with respect to all internal parts of a semiconductor device, such as a memory device. Therefore, such test processes are also carried out with respect to a memory cell of the memory device storing data, which relates to the present invention.

Conventionally, when a defect of a memory cell is found during a wafer level test, a repair fuse of a word line or a bit line connected to a detected cell is cut so as to replace the defected cell with a redundancy cell.

In contrast, if the defect of the memory cell is found during a package level test, a method utilizing an anti-fuse is used. However, in order to realize the above method utilizing the anti-fuse, an additional circuit is necessary, so a size of a memory chip is enlarged and a yield rate is decreased.

SUMMARY OF THE INVENTION

Accordingly, the present invention has been made to solve the above-mentioned problems occurring in the prior art, and a first object of the present invention is to provide a method for detecting a defected cell during a wafer level test by changing wafer test conditions.

A second object of the present invention is to provide a method for improving a yield rate of semiconductor devices by reducing a probability of defected cells detected during a package level test.

A third object of the present invention is to provide a method for detecting a column fail by adjusting a timing of driving voltage applied to a sense amplifier.

In order to accomplish these objects, there is provided a method for detecting a column fail by controlling a sense amplifier of a memory device, the method comprising the steps of: i) enabling a word line of a memory cell of the memory device; ii) adjusting a timing of a high-level driving voltage and a low-level driving voltage applied to the sense amplifier; and iii) detecting an amplification result of the sense amplifier.

According to the preferred embodiment of the present invention, in step ii), in a test mode, the high-level driving voltage is firstly applied to the sense amplifier and the low-level driving voltage is secondly applied to the sense amplifier after a predetermined time lapse.

According to another embodiment of the present invention, in step ii), in a test mode, the low-level driving voltage is firstly applied to the sense amplifier and the high-level driving voltage is secondly applied to the sense amplifier after a predetermined time lapse.

According to the preferred embodiment of the present invention, in step ii), in a test mode, the low-level driving voltage is applied to the sense amplifier in connection with a control signal enabling the word line, and a timing of the high-level driving voltage applied to the sense amplifier is adjusted.

According to another embodiment of the present invention, in step ii), in a test mode, the high-level driving voltage is applied to the sense amplifier in connection with a control signal enabling the word line, and a timing of the low-level driving voltage applied to the sense amplifier is adjusted.

In step ii), in a normal mode, the low-level driving voltage and the high-level driving voltage are simultaneously applied to the sense amplifier.

According to the preferred embodiment of the present invention, there is provided an apparatus for detecting a column fail by controlling a sense amplifier of a memory device. The apparatus comprises a first control signal generating circuit for generating a first control signal capable of controlling an operation of a first driving section, which applies a high-level driving voltage to the sense amplifier, and a second control signal generating circuit for generating a second control signal capable of controlling an operation of a second driving section, which applies a low-level driving voltage to the sense amplifier. In a test mode, the first and second control signals are generated with a predetermined time interval so that an enabling time of the first driving section is different from an enabling time of the second driving section, thereby detecting data amplified by the sense amplifier.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
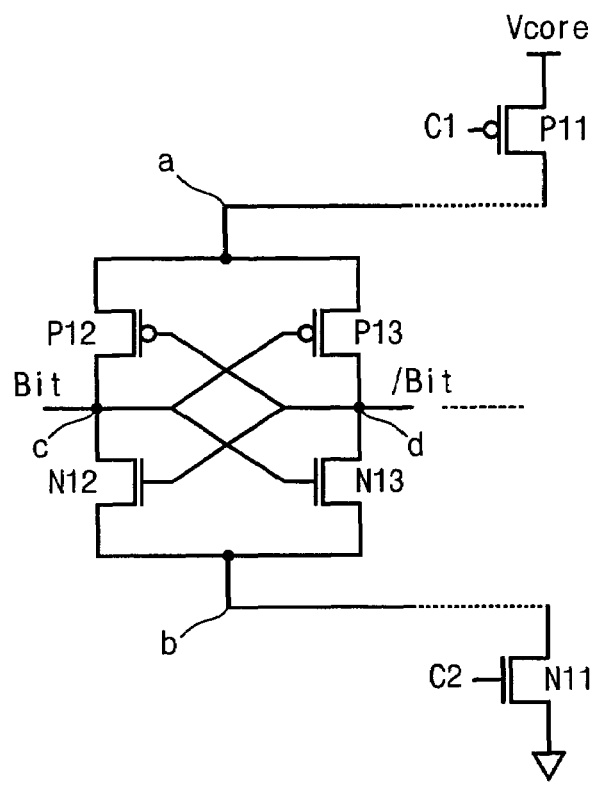
FIG. 1 is a view showing a sense amplifier used in a conventional memory device.

Hereinafter, a preferred embodiment of the present invention will be described with reference to the accompanying drawings. In the following description and drawings, the same reference numerals are used to designate the same or similar components, and so repetition of the description on the same or similar components will be omitted.

FIG. 1 is a view showing a sense amplifier used in a conventional memory device. The sense amplifier shown in FIG. 1 is used for a general volatile memory device.

As shown in FIG. 1, the sense amplifier is a latch circuit including two CMOS inverters as latch circuits. That is, the sense amplifier includes a first PMOS transistor P12 and a first NMOS transistor N12 connected between nodes a and b in series, and a second PMOS transistor P13 and a second NMOS transistor N13 connected between the nodes a and b in series. Herein, a common gate of the first PMOS transistor P12 and the first NMOS transistor N12 is connected to a node d, and a common gate of the second PMOS transistor P13 and the second NMOS transistor N13 is connected to a node c. The node c is a drain of the first NMOS transistor N12 and is connected to a bit line Bit. In addition, the node d is a drain of the second NMOS transistor N13 and is connected to a bit line /Bit.

In FIG. 1, a PMOS transistor P11 is a driving transistor for transferring high-level driving voltage Vcore to the node a when a control signal C1 maintains in a low-level. In addition, an NMOS transistor N11 is a driving transistor for transferring ground voltage to the node b when a control C2 maintains in a high-level.

An operation of the sense amplifier shown in FIG. 1 is as follows.

If a word line of a memory cell is enabled, electric charge stored in the memory cell is transferred to the bit line so that voltage of the bit line is varied. For instance, if high data information is stored in the memory cell, an electric potential of the bit line may exceed pre-charge voltage.

Then, control signals C1 and C2 are enabled so that driving voltage Vcore is transferred to the node a of the sense amplifier and ground voltage is transferred to the node b.

Figure 5A:
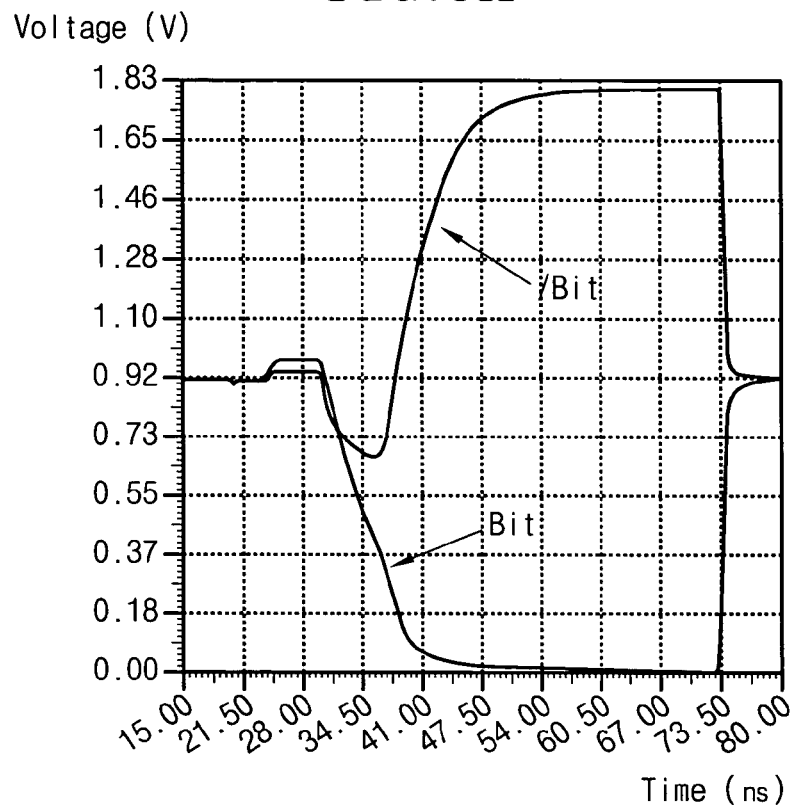
FIGS. 5A and 5B are graphs showing simulation test results according to tests of the present invention.
Figure 5B:
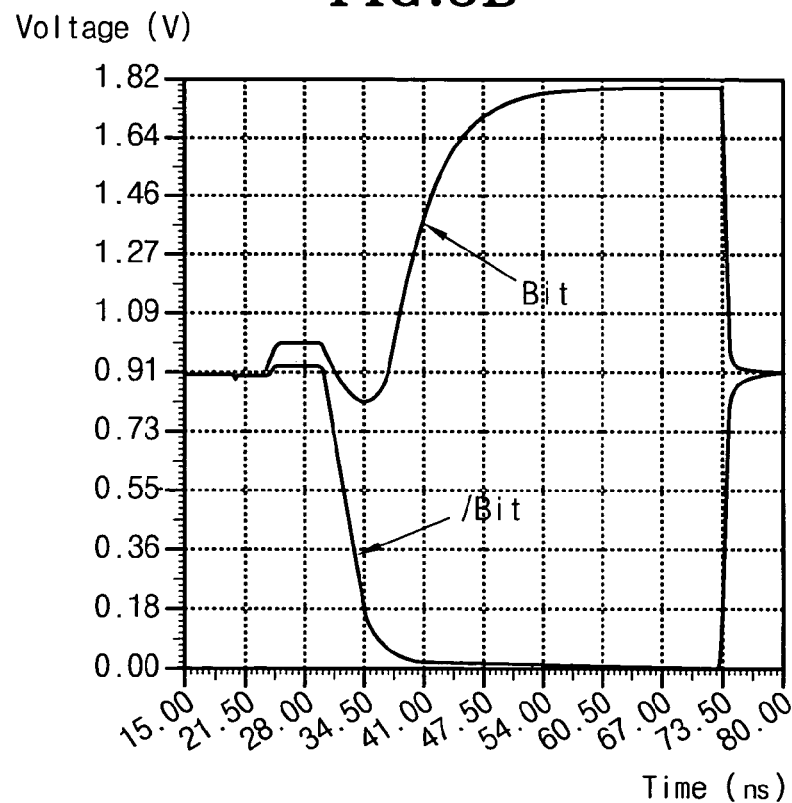

In this case, as is well-known in the art, the first and second NMOS transistors N12 and N13 are turned on so that voltage of the nodes c and d may decrease (referred to FIG. 5B). That is, the voltage levels of the bit lines Bit and /Bit are dropped down for a predetermined period of time as shown in FIG. 5B. However, since voltage of the bit line /Bit is dropped down faster than voltage of the bit line Bit, the first PMOS transistor P12 is turned on. Accordingly, voltage of the bit line Bit may rise as shown in FIG. 5B.

Such an operation of the sense amplifier may be represented under a normal state of the sense amplifier. If capacitance storage of the memory cell is lower than a mean value thereof or characteristics of some transistors forming the sense amplifier do not match with predetermined levels required by a designer, the malfunction of the sense amplifier may occur. If such malfunction of the sense amplifier occurs during the package level test process, a yield rate is decreased.

According to the present invention, in order to easily detect the fault of the memory cell or the sense amplifier during the wafer level test process, driving voltage of the sense amplifier is applied based on a time lag.

Figure 2A:
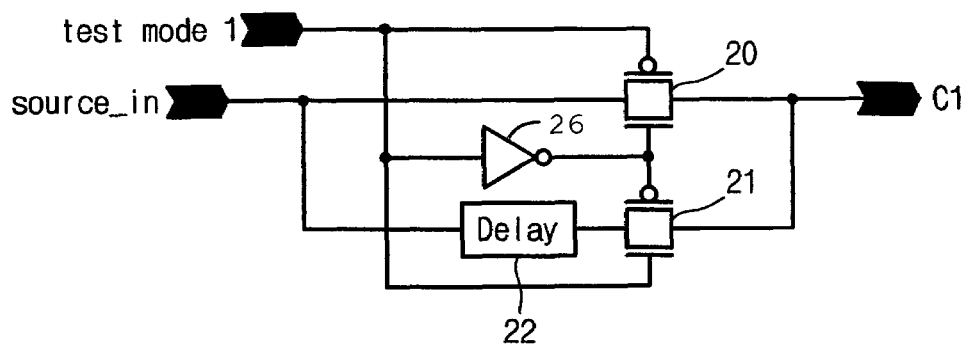
FIGS. 2A and 2B are views showing control signal generating circuits of a sense amplifier according to one embodiment of the present invention.
Figure 2B:
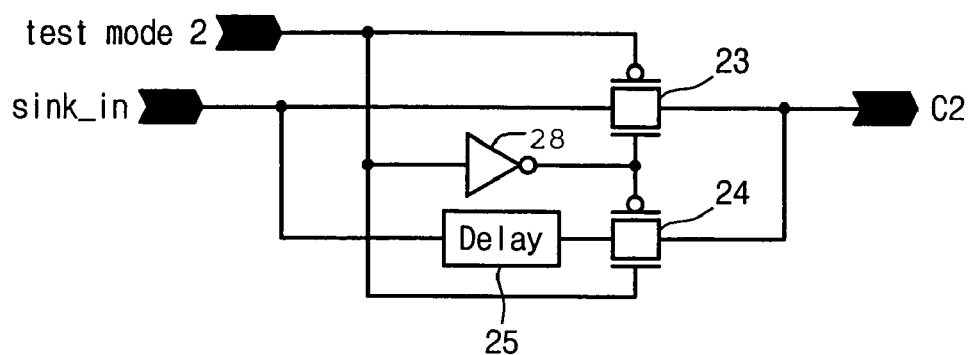
Figure 2C:
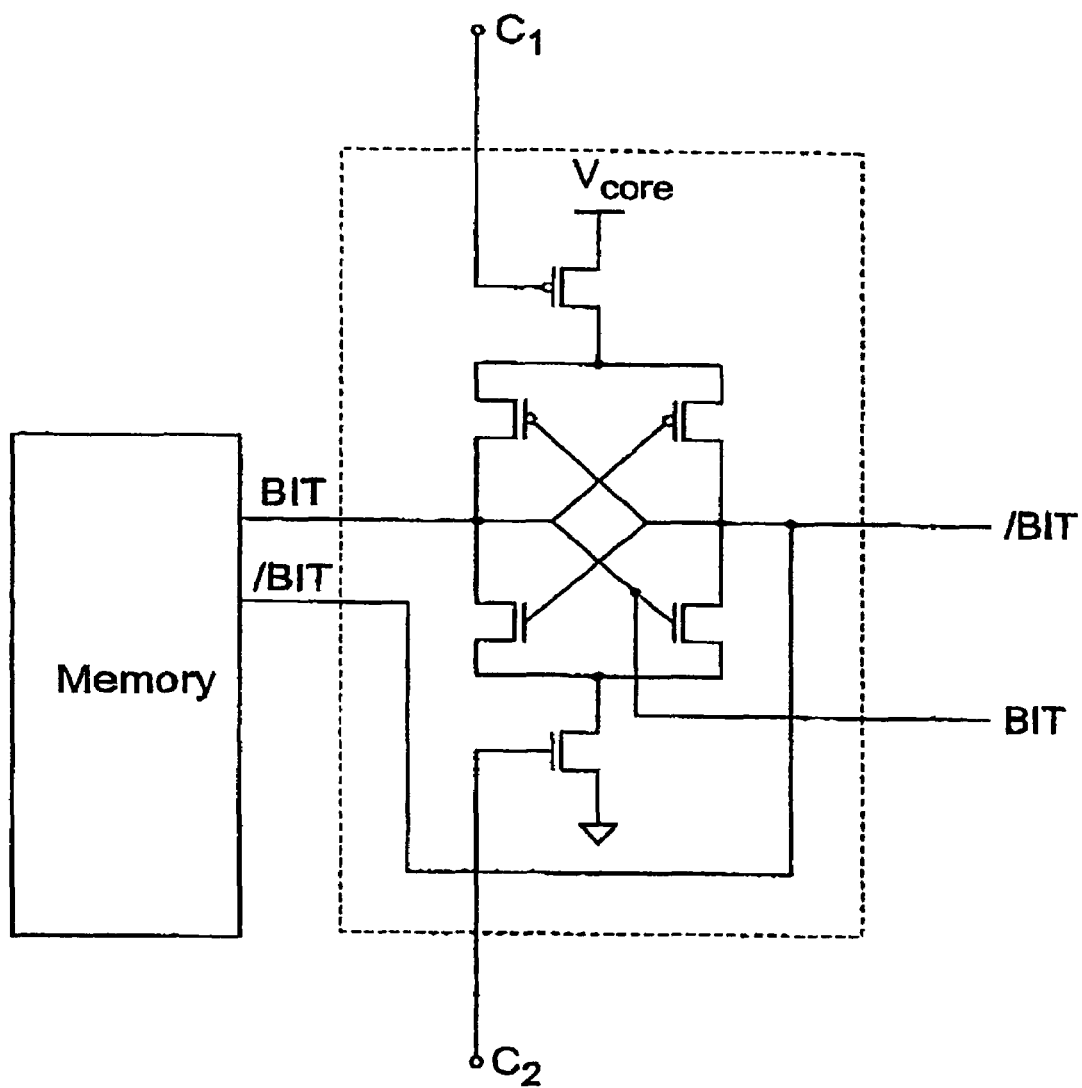
FIG. 2C depicts a memory device having a sense amplifier, wherein a sense amplifier failure can be detected by controlling control inputs arid, by a comparing voltages on BIT and /BIT lines in response thereto.

FIGS. 2A and 2B are views showing control signal generating circuits of the sense amplifier according to one embodiment of the invention. FIG. 2C depicts a memory device having a sense amplifier with control inputs C1 and C2 and BIT and /BIT lines, the control of C1 and C2 enables a sense amplifier failure to be detected by the comparison of voltages on BIT and /BIT lines.

FIG. 2A shows a control signal generating circuit for generating control voltage C1 of the sense amplifier, which applies an input signal (source_in) to a gate of the driving transistor P11 of the sense amplifier shown in FIG. 1 through transmission gates 20 and 21, which are turned on/off by means of a logic level of a test mode signal.

As shown in FIG. 2A, when the first test mode signal, "test mode 1" has a low level, the output of inverter 26 will be at a high level, causing the transmission gate 20 to be turned on the output of which appears at C1, which is the gate to P11. Thus, the input signal (source_in) is applied to the gate of the transistor P11 as shown in FIG. 1 through the transmission gate 20.

In contrast, if the first test mode signal, "test mode 1" has a high level the output of inverter 26 will be at a low level, causing transmission gate 20 to turn off and causing the transmission gate 21 to be turned on. Thus, when the test mode 1 input signal level is at a high level, the input signal(source_in) is applied to the gate of the transistor P11 shown in FIG. 1 through delay unit 22 and the transmission gate 20. Accordingly, the input signal(source_in) is applied to the gate of the transistor P11 after a predetermined period of time lapses.

FIG. 2B shows a control signal generating circuit for generating control voltage C2 of the sense amplifier, which applies an input signal (sink_in) to a gate of the driving transistor N11 of the sense amplifier shown in FIG. 1 through transmission gates 23 and 24, which are turned on/off by means of a logic level of a second test mode signal.

As shown in FIG. 2B, when the second test mode signal "test mode 2" has a low level, the output of inverter 28 will be at a high level, causing the transmission gate 23 to be turned on. Thus, the input signal (sink_in) is applied to "C2" which is the gate of the transistor N11 shown in FIG. 1 through the transmission gate 23.

In contrast, if the test mode signal "test mode 2" has a high level, the output of inverter 28 will be at a low level, causing transmission gate 20 to turn off and causing the transmission gate 24 to be turned on. Thus, the input signal is applied to the gate C1 of the transistor N11 shown in FIG. 1 through delay unit 25 and the transmission gate 24. Accordingly, the input signal (sink_in) is applied to the gate of the transistor N11 after a predetermined period of time lapses.

A timing of drive voltage Vcore and Vss applied to the sense amplifier can be controlled by using the control signal generating circuit shown in FIGS. 2a and 2b. That is, a timing for applying input signals (source_in and sink_in) to the drive transistors P11 and N11 can be controlled by adjusting logic levels of the first and second mode signals.

Figure 3A:
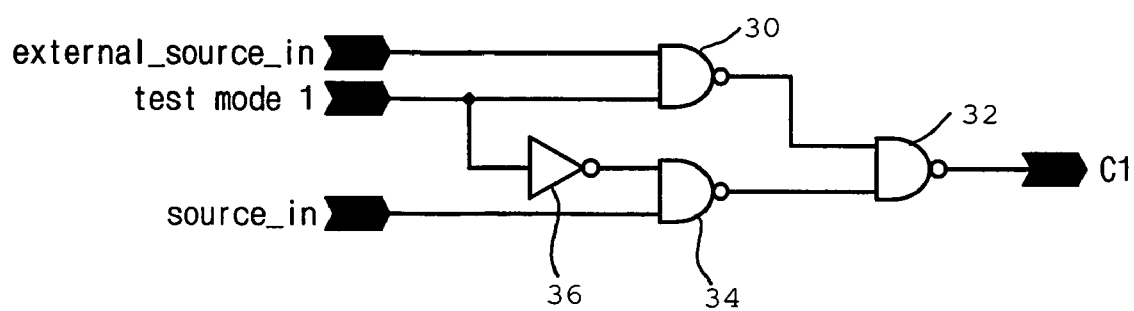
FIGS. 3A and 3B are views showing control signal generating circuits of a sense amplifier according to another embodiment of the present invention.
Figure 3B:
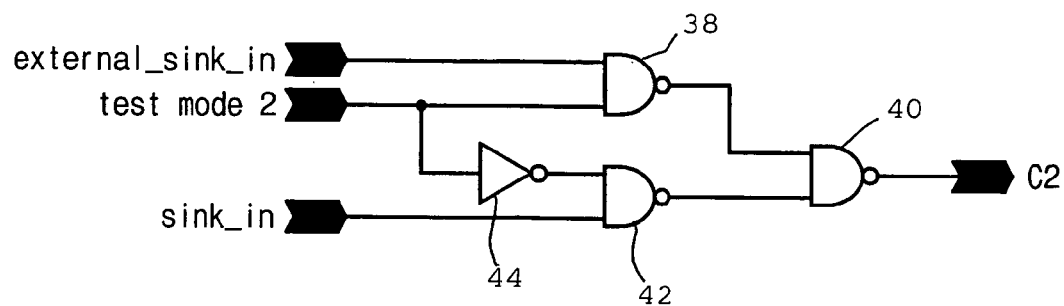

FIGS. 3A and 3B are views showing control signal generating circuits of a sense amplifier according to another embodiment of the present invention.

The control signal generating circuits shown in FIGS. 3A and 3B generate control signals C1 and C2 by using external signals (exernal_source_in, exernal_sink_in) applied to combinational logic gates 30, 32, 34 and 36 shown in FIG. 3A and combinational logic gates 38, 40, 42 and 44 shown in FIG. 3B.

Referring to both FIGS. 3A and 3B, when first and second test mode signals "test mode 1" and "test mode 2" respectively have a high-level and when the "external source in" signal has a high level, the output of NAND gates 30 and 38 will be at a low level driving the output of NAND gates 32 and 40 to be at a high level, regardless of the state of the "source in" signal. When the first and second test mode signals are at a low level, NAND gates 30 and 38 outputs will be at a high level and the outputs of INVERTERS 36 and 44 will also be at a high level. So long as the outputs of INVERTERS 36 and 44 are at high level, NAND gates 34 and 42 act as inverters to the "source in" and "sink in"

signals respectively. Because the outputs of NAND gates 30 and 38 are at a high level when "test mode 1" and "test mode 2" are at low levels, the outputs of the NAND gates 34 and 42 are inverted by NAND gates 32 and 40 respectively. Thus, when "test mode 1" or "test mode 2" is a low level, the "source in" and "sink in" signal will appear at C1 and C2. By controlling the timing of the external signals applied to these circuits the timing of C1 and C2 to the sense amplifier can be controlled.

The circuits shown in FIGS. 2 and 3 are examples of control signal generating circuits and various modifications thereof are also possible.

Figure 4:
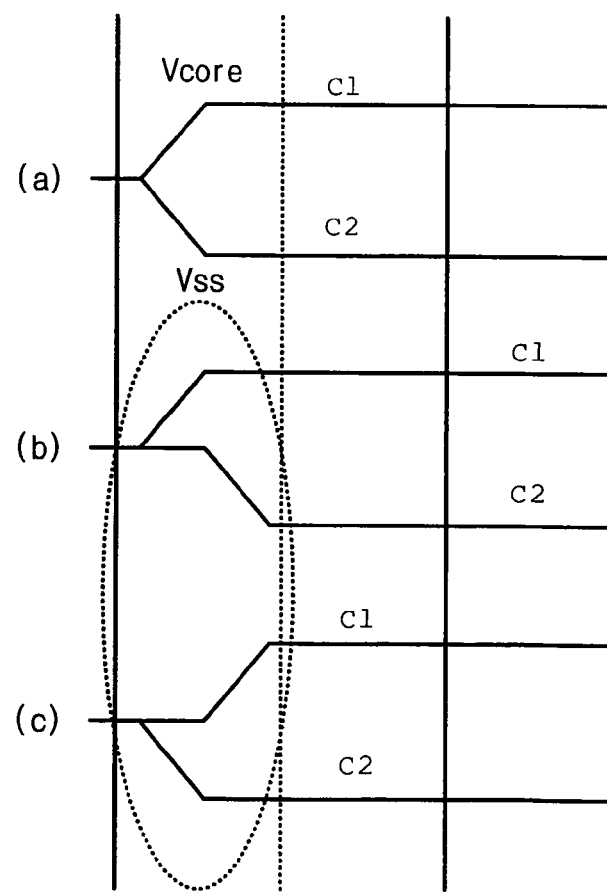
FIG. 4 is a view showing a timing of control signals C1 and C2 applied to gates of driving transistors P11 and N11 of a sense amplifier shown in FIG. 1.

FIG. 4 is a view showing a timing of control signals C1 and C2 applied to gates of driving transistors P11 and N11 of the sense amplifier shown in FIG. 1.

In FIG. 4, (a) represents the timing of control signals C1 and C2 in a general case, and (b) and (c) represent the timing of control signals C1 and C2 when driving the sense amplifier according to the present invention.

That is, (a) represents that control signals C1 and C2 are simultaneously enabled so as to simultaneously operate the driving transistors P11 and N11.

In addition, (b) represents that the driving transistor P11 is firstly turned on by means of the control signal C1, and the driving transistor N11 is secondly turned on by means of the control signal C2 after a predetermined time lapses.

Meanwhile, (c) represents that the driving transistor N11 is firstly turned on by means of the control signal C2, and the driving transistor P11 is secondly turned on by means of the control signal C1 after a predetermined time lapses.

FIGS. 5A and 5B are graphs showing simulation test results according to tests of the present invention. FIG. 5A represents the simulation test result when the memory cell or a transistor forming the sense amplifier has a fault and FIG. 5B represents the simulation test result when the memory cell or the transistor is normally operated.

Firstly, the simulation test result shown in FIG. 5A will be described below.

For instance, when voltage variation of the bit line Bit is small due to a small capacitance storage of the memory cell, if the simulation test is carried out by normally operating the sense amplifier while applying control signals as shown in (a) of FIG. 4, the defect of cell may not be found in some cases.

However, according to the present invention, the timing of driving voltage applied to the sense amplifier is adjusted, so it is possible to detect the fault of the memory cell or the transistor forming the sense amplifier as shown in FIG. 5A.

That is, as shown in (c) of FIG. 4, if the driving transistor P11 is turned on after the driving transistor N11 of the sense amplifier shown in FIG. 1 has been turned on, voltage is dropped down for a while.

When the driving transistor P11 has been turned on, the simulation test must be represented as shown in FIG. 5B if the sense amplifier is normally operated. However, if the memory cell or the transistors P12 and P13 forming the sense amplifier have faults, the sense amplifier does not perform a normal amplification as shown in FIG. 5A.

Such a result may be identically represented when the driving transistor P11 is firstly turned on by means of the control signal C11, and the driving transistor N11 is secondly turned on by means of the control signal C2 after a predetermined time lapses.

As described above, according to the present invention, the malfunction of the sense amplifier can be tested by adjusting the timing of driving voltage applied to the sense amplifier. As a result of the test, if the sense amplifier malfunctions, it is determined that the column fail occurs, so the cell having a fault is replaced with a redundancy cell.

In addition, the present invention can be realized by using only one control signal generating circuit. That is, the operation timing of the sense amplifier can be controlled by using one of control signal generating circuits shown in FIGS. 2 and 3, after applying driving voltage to the sense amplifier in connection with a word line enable signal.

In addition, when the sense amplifier is normally operated after the test has been finished, driving voltages for the sense amplifier are simultaneously enabled.

As can be seen from the foregoing, according to the present invention, the defected cell of the memory device is detected during the wafer level test step so that the defected cell can be replaced with the redundancy cell, thereby lowering probability of the defected cells detected during the package level test. The present invention can detect the column fail derived from the faults of the memory cell and the sense amplifier before the package level test is carried out, so the yield rate of the semiconductor devices can be improved.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of detecting a memory device failure in a memory device having a sense amplifier, said memory device also having a BIT line and a /BIT line, said sense amplifier further having C1 and C2 inputs, an improvement comprising the steps of:

i) applying a first output signal to the C1 input of the sense amplifier, said first output signal originating from and being generated by a first control signal generating circuit that generates said first output signal in response to a first test mode signal and in response to a source-in signal, both of which are input to said first control signal generating circuit; and ii) after the first output signal is applied to the C1 input, applying a second output signal to the C2 input of the sense amplifier, said second output signal originating from and being generated by a second control signal generating circuit that generates said second output signal in response to a second test mode signal and in response to a sink-in signal, both of which are input to said second control signal generating circuit;

wherein a sense amplifier failure can be determined by comparing a first voltage on BIT and /BIT lines when the sense amplifier has failed.

2. The method as claimed in claim 1, wherein, in step i), in a first operating mode, the first control signal generating circuit generates a high-level driving voltage that is first applied to the C1 input and, after a time delay, the second control signal generating circuit generates a low-level driving voltage that is applied to the C2 input of the sense amplifier.

3. The method as claimed in claim 1, wherein, in step i), in a first operating mode, the first control signal generating circuit generates a low-level driving voltage that is first applied to the C1 input of the sense amplifier and, after a time delay, the second control signal generating circuit generates a high-level driving voltage that is applied to the C2 input of sense amplifier.

4. The method as claimed in claim 1, wherein, in step i), in a first operating mode, a low-level driving voltage is applied to one of the C1 and C2 inputs of the sense amplifier in connection with a control signal enabling a word line in a memory device coupled to sense amplifier and which memory device has word lines and bit lines, and wherein the timing of the application of a high level voltage to the C1 input to the sense amplifier is adjusted.

5. The method as claimed in claim 1, wherein, in step i), in a first operating mode, a high-level driving voltage is applied to at least one of the C1 and C2 inputs of the sense amplifier in connection with a control signal enabling a word line in a memory device coupled to first sense amplifier and which memory device has word lines and bit lines, and wherein the timing of a low-level driving voltage applied to C2 input of the sense amplifier is adjusted.

6. The method as claimed in claim 1, wherein, in step i), in a second operating mode, a low-level driving voltage and a high-level driving voltage are simultaneously applied to the C1 and C2 inputs of the sense amplifier respectively.

* * * * *